(12) United States Patent
Kauper

(10) Patent No.: US 10,391,592 B2
(45) Date of Patent: Aug. 27, 2019

(54) MANUFACTURING OF HOLEMAKING TOOLS

(71) Applicant: KENNAMETAL INC., Latrobe, PA (US)

(72) Inventor: Herbert Rudolf Kauper, Erlangen (DE)

(73) Assignee: KENNAMETAL INC., Latrobe, PA (US)

( * ) Notice: Subject to any disclaimer, the term of this patent is extended or adjusted under 35 U.S.C. 154(b) by 0 days.

(21) Appl. No.: 15/148,623

(22) Filed: May 6, 2016

(65) Prior Publication Data

US 2016/0279747 A1 Sep. 29, 2016

Related U.S. Application Data

(62) Division of application No. 13/676,692, filed on Nov. 14, 2012, now Pat. No. 9,358,626.

(30) Foreign Application Priority Data

Nov. 15, 2011 (DE) ........................ 10 2011 086 422

(51) Int. Cl.
| | |
|---|---|
| *B23B 51/08* | (2006.01) |
| *B23D 77/00* | (2006.01) |
| *B23P 15/32* | (2006.01) |
| *C23C 14/22* | (2006.01) |
| *C23C 30/00* | (2006.01) |

(52) U.S. Cl.
CPC .............. *B23P 15/32* (2013.01); *B23B 51/08* (2013.01); *B23D 77/00* (2013.01); *C23C 14/22* (2013.01); *C23C 30/005* (2013.01); *B23B 2228/08* (2013.01); *B23B 2228/10* (2013.01); *B23B 2228/105* (2013.01); *Y10T 408/78* (2015.01); *Y10T 408/905* (2015.01); *Y10T 408/9065* (2015.01)

(58) Field of Classification Search
CPC ........... B23P 15/32; B23P 15/28; B23P 15/34; B23P 15/46; B23B 51/02; B23B 51/08; B23B 2222/28; B23B 2222/08; B23B 2222/10; B23B 2222/105; Y10T 408/905; Y10T 408/9065; Y10T 408/78
USPC ..... 76/108.1–108.6; 408/144, 145, 223, 224, 408/225, 227, 229, 230
See application file for complete search history.

(56) References Cited

U.S. PATENT DOCUMENTS

| | | | | |
|---|---|---|---|---|
| 5,467,670 A | * | 11/1995 | Alverio ..................... | B23C 5/10 76/104.1 |
| 2005/0169721 A1 | | 8/2005 | Schulte | |
| 2007/0284255 A1 | * | 12/2007 | Gorokhovsky ....... | C23C 14/024 205/89 |

(Continued)

OTHER PUBLICATIONS

Oct. 9, 2015 Final Office Action.
Oct. 28, 2015 Final Office Action.
Jun. 13, 2018 Foreign OA.

*Primary Examiner* — Laura M Lee
(74) *Attorney, Agent, or Firm* — Matthew S. Bedsole

(57) ABSTRACT

A process for producing a tool having a main body which extends in a longitudinal direction and at least one blade for machining a workpiece includes providing a base coating on the tool; grinding the at least one blade in a manner that removes the base coating in the region of the at least one blade; and providing a second, fine coating, to the at least one ground blade.

19 Claims, 4 Drawing Sheets

(56) References Cited

U.S. PATENT DOCUMENTS

2011/0176878 A1* 7/2011 Nomura .............. B23B 51/0493
408/83
2011/0188956 A1* 8/2011 Mueller ................. B23B 51/02
408/230

* cited by examiner

MANUFACTURING OF HOLEMAKING TOOLS

RELATED APPLICATION DATA

This application is a divisional application and claims benefit of U.S. nonprovisional application Ser. No. 13/676,692, filed Nov. 14, 2012, and German Patent Application Number 102011086422.9 filed Nov. 15, 2011, each of which are incorporated herein by reference in their entireties.

BACKGROUND

Field of the Invention

The invention relates to a process for producing a tool which is provided with at least one blade and is intended for the machining of a workpiece. More particularly, the invention relates to a process for producing a reaming tool and preferably for producing a drilling/reaming tool. The invention also relates to a tool produced in particular by this process, in particular a drilling/reaming tool.

Background Information

A drilling/reaming tool is disclosed, for example, by DE 101 44 241 B4. The drilling/reaming tool described therein has two main (drilling) blades, which are respectively assigned a spiraled main chip flute, which is incorporated in a main body of the tool. Additionally provided circumferentially are three reaming blades, which are spaced apart from one another in the circumferential direction and protrude in the radial direction somewhat beyond the main blades. The reaming blades in this case directly adjoin the main blades. Each reaming blade is assigned a reaming flute, which is likewise formed in a spirally running manner in a heel of the main body between the two main chip flutes.

Such drilling/reaming tools serve for producing a drilled hole and for the simultaneous finishing operation on the wall of the hole with the aid of the reaming blades. It is important here for machining to be as highly accurate as possible, in order to achieve the desired surface quality of the wall of the hole. Also among the decisive factors here is effective transporting away of the chips. Here it must be avoided in particular that a chip becomes caught between the wall of the hole and the tool, which would result in the machined wall of the hole becoming damaged. At the same time, the transporting away of the chips becomes more difficult as the depth of the drilled hole increases.

Cutting tools, such as drills, milling cutters or reaming tools as well as parts thereof, such as for example cutting inserts, are often provided with coatings—depending on the intended application and requirement—for example to increase the wear resistance and/or to improve the sliding properties.

U.S. Pat. No. 5,354,155 discloses a drilling/reaming tool which has a conically tapering drill region and a reaming region adjoining thereto. A main body is in this case provided in the drill region with a diamond coating, which is adjoined in the reaming region by a second diamond coating, different from the first, and finer. The coatings have in this case been applied by means of a plating process.

US 2009/0116913 A1 discloses a reaming tool which has PCD cutting inserts (polycrystalline diamond) and is additionally provided with a diamond-like carbon coating (DLC coating).

US 2007/0298280 A1 discloses a cutting tool with a multilayered construction.

For cutting tools for rough machining, such as drills or milling cutters, often coatings with a great layer thickness in the range of 10 µm or more are applied, in order to achieve a wear resistance which is as great as possible.

This leads in the region of the blades to a rounding on the cutting edges. Sometimes, even lug-like thickenings form there. Such roundings are disadvantageous in the case of fine machining tools, such as for example reaming tools, and have an adverse effect on the surface quality of the machined workpiece. There is also the risk of such a thick coating in the region of the cutting edge being damaged and peeling off during the cutting operation.

SUMMARY OF THE INVENTION

Against this background an object of the present invention is based on making possible a tool which can be produced simply and cost-effectively, in particular a fine machining tool and preferably a combined tool, such as a drilling/reaming tool, which is distinguished by a good wear resistance and a long service life without the risk of a peeling-off coating.

As one aspect of the present invention, a process for producing a tool is provided. As another aspect of the present invention, a tool for machining a workpiece is provided.

For producing the tool, it is accordingly provided that initially a main body of the tool is provided with a base coating, formed in particular as a thick coating, this being followed in the region of a blade of the tool, in particular a blade for fine machining, by a grinding of the blade, whereby the base coating applied in the region of the blade is removed again. Subsequently, in a second coating process, a fine coating, formed in particular as a thin coating, is applied to this ground blade.

Also formed in a corresponding way is a tool according to the invention, which has a main body with a base coating applied thereto, the base coating having been removed and replaced by a fine coating in the region of the blade.

This measure achieves the particular advantage that, on the one hand, the base coating achieves a high wear resistance, but at the same time only a fine coating is applied in the region of the blade, so that the risk of the coating peeling away is avoided.

The specially chosen production process, according to which initially the entire main body is provided with the base coating, while subsequently, in the second step, it is partially removed again by a grinding operation in the region of the relevant blades for the fine machining and subsequently, in the third step, the fine coating is again applied, makes it possible to obtain a production process which is simple overall.

In an expedient development, it is provided in this respect that the blade is only incorporated, in particular ground, in the main body after application of the base coating. This means that the blade provided at the end with the fine coating is only ground once, to be precise after application of the base coating, and thereby formed for the first time, thereby keeping down the complexity that production involves.

Expediently, the fine coating has in this case a smaller layer thickness than the base coating, in particular a layer thickness smaller by a factor of 2 to 10. The layer thickness of the fine coating is in this case preferably approximately 1 to 2 µm. This avoids, at least to a great extent, the risk of lug formation in the region of the cutting edge of the blade, and consequently the risk of a peeling off of the coating during operation.

The fine coating, and preferably additionally also the base coating, are expediently applied with the aid of a vapor depositing process, that is to say by depositing from a vapor phase. In particular, the fine coating is applied by means of the so-called PVD process (Physical Vapor Deposition). The base coating is preferably likewise applied by means of the PVD process.

With a view to a production process which is as simple as possible, partial regions of the main body are not covered when the coatings are applied. This has the effect on the finished tool that the fine coating also extends at least into partial regions over the base coating and overlaps it. Usually, the entire main body—completely coated apart from a chucking shank with which the tool is received in a tool receptacle of a machine tool—is completely coated. The fine coating therefore extends over the entire main body, possibly with the exception of the chucking shank. The base coating likewise extends over the entire main body with the exception of the chucking shank and with the exception of the regions which have been ground again after the application of the base coating.

It is expediently provided in this respect that the base coating and the fine coating consist of the same material. In principle, there is also the possibility of choosing different material compositions for the base coating and the fine coating.

The process described here is used in particular in the case of combined tools, which have at least one blade for rough machining and at least one blade for fine machining. In the case of such combination tools, expediently only the blades for the fine machining are ground after application of the base coating and then provided with the fine coating. The tool is in this case generally a rotational tool, that is to say a tool which extends along an axis of rotation and is rotatable about the axis of rotation during operation. The main body is ground here to a desired size before the application of the base layer.

In particular, the tool is a drilling/reaming tool, on the end face of which a drill tip with at least one main drilling blade is formed. Furthermore, at least one reaming blade is formed circumferentially. After the application of the base coating, only the reaming blade is ground. Expediently, a number of reaming blades are in this case assigned to a respective drilling blade. The reaming blades protrude in the radial direction beyond the drilling blade and thereby define the final drilling diameter in the workpiece.

In this respect, usually each drilling blade is assigned a main chip flute and each reaming blade is assigned a reaming flute. The main chip flutes have a distinctly increased flute cross-sectional area in comparison with the reaming flutes, and are therefore formed for transporting away a much greater chip volume. The main machining performance is provided by the drilling blades.

According to an expedient development, the drill tip is adjoined as directly as possible by a reaming head with a number of reaming blades and assigned reaming flutes. Expediently, the entire reaming head is only formed after application of the base layer, in particular by grinding.

The tool is preferably a solid metal tool, in particular a solid carbide tool, which is worked from solid material, that is to say from a blank, by grinding. In principle, it may alternatively be provided for this purpose that the drilling blades and/or the reaming blades are formed by cutting inserts. Both the base coating and the fine coating are a wear-resistant layer, that is to say substantially a hard coating with a hardness which is greater in comparison with the main body.

To sum up, the special production process is distinguished at least by the sequence of the following steps in particular:
  a) grinding a blank (round bar) to a desired size, in particular from solid carbide,
  b) grinding a drilling tip with at least one main drilling blade and grinding in the main chip flutes respectively assigned to the main drilling blades,
  c) applying the base coating to the unfinished main body formed in such a way,
  d) forming the reaming head by grinding the reaming blades and the reaming flutes, whereby the base coating is destroyed again in the region of the reaming head, at least in the region of the reaming blades,
  e) applying the fine coating at least in the region of the reaming head, preferably over the entire main body.

This production process is suitable in particular for tools with relatively large nominal drilling diameters, for example ≥10 mm.

The process steps described in conjunction with the process are reflected on the finished tool itself in a preferred way. Thus, on account of the base coating still present there, and possibly the additional fine coating, the main blade has a rounding of which the radius is greater than a rounding resulting from the fine coating on the respective reaming blade.

The drilling/reaming tool is preferably a drilling/reaming tool such as that described in the applicant's U.S. application Ser. No. 13/536,212—apart from the specific configuration of the coating. To this extent, reference is made to the full content of this application and it is hereby included in the present application by reference.

BRIEF DESCRIPTION OF THE DRAWINGS

Exemplary embodiments of the invention are explained in more detail below on the basis of the figures in which, partly in a simplified representation.

In the figures, parts which have the same effect are provided with the same reference numerals.

DESCRIPTION OF THE PREFERRED EMBODIMENTS

Figure 1:
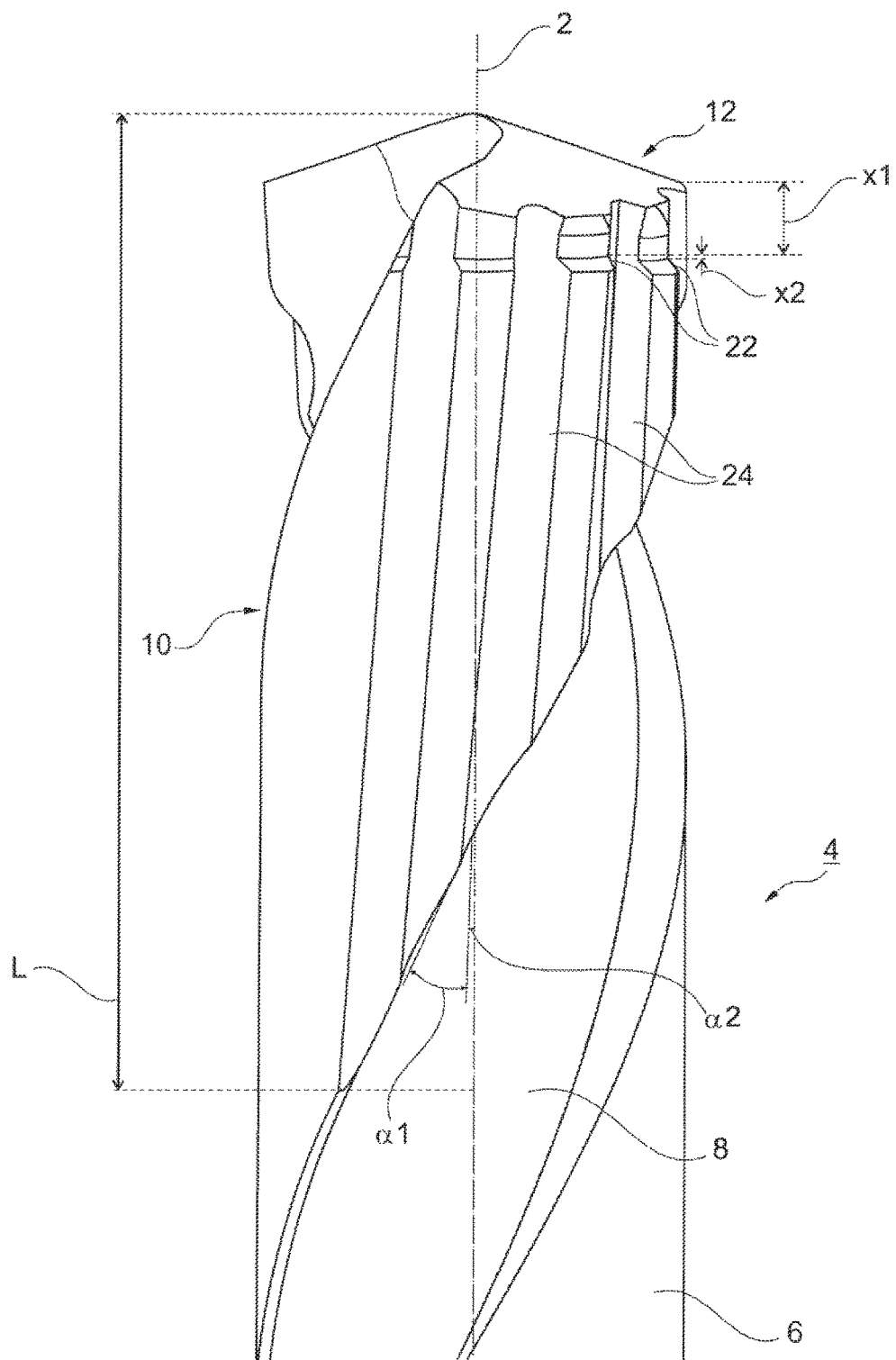
FIG. 1 shows a side view in the form of a detail of a drilling/reaming tool.

A drilling/reaming tool 4, which extends in the longitudinal direction 2, hereafter tool for short, has a main body 6, which extends in the longitudinal direction 2 and incorporated in which are main chip flutes 8, two in the exemplary embodiment, which are spiraled at a first twist angle $\alpha 1$. In the forward region, the tool 4 has a reaming head 10. On its end face, the reaming head 10 is formed as a drilling tip 12, which in the exemplary embodiment has two main blades 14 (cf. FIG. 3), which are joined to one another in the drilling center by way of a center line 16. In the circumferential direction, the respective main blade 14 is adjoined by a clearance face 18, which in the exemplary embodiment is formed like the envelope of a cone, respectively extends up to the main chip flute 8 and is assigned to the next following main blade 14. The fluted region of the main body 6 is additionally adjoined by a shank (not represented), by which the tool 4 is clamped in a tool receptacle of a machine tool.

Defined between the main chip flutes 8 is a heel 20, in which a number of reaming blades 22 are formed circumferentially in the forwardmost region, directly adjoining the drilling tip 12, in the region of the reaming head 10. As can be seen in particular from FIGS. 1 and 2, the reaming blades 22 are arranged set back somewhat in the longitudinal direction 2 from the clearance face 18 in the form of an envelope of a cone. The axial offset ×1 between the radially outermost end of the main blade 14 and the first reaming blade 22 in this case lies in the range of only a few mm, that is to say a fraction (less than 20%) of a nominal diameter D of the tool 4.

The reaming blades 22 respectively extend substantially in an approximately radial direction and are oriented approximately perpendicularly in relation to the longitudinal direction 2. The reaming blades 22 here define the nominal diameter D of the tool 4. All of the reaming blades 22 lie in this case on the same nominal diameter D. In contrast, the main blades 14 of the drilling tip 12 reach only up to a drilling diameter d, which is slightly less than the nominal diameter D. The nominal diameter D is in this case typically approximately 0.2 to 1 mm greater than the drilling diameter d.

Each reaming blade 22 is assigned a reaming flute 24, which is incorporated in the main body 6 and embodied in a spiraled manner at a second twist angle α2. A respective reaming blade 22 is respectively adjoined by a secondary reaming blade 26, which is made to run along the respective reaming flute 24. Correspondingly, a main secondary blade (not represented any more specifically here) is also provided adjoining a respective main blade 14.

As can be seen in particular from FIG. 1, the two twist angles α1, α2 are formed differently; the chip flutes 8, 24 therefore do not run parallel to one another. In the exemplary embodiment of FIGS. 1 to 3, it is in this respect provided that the first twist angle α1 of the main chip flutes 8 is much greater than the second twist angle α2 of the reaming flutes 24. In the exemplary embodiment, the first twist angle α1 lies approximately in the range of 30° and the second twist angle α2 lies approximately in the range of approximately 10°. Generally, the two twist angles differ approximately by a factor in the range of 2-4.

Figure 2:
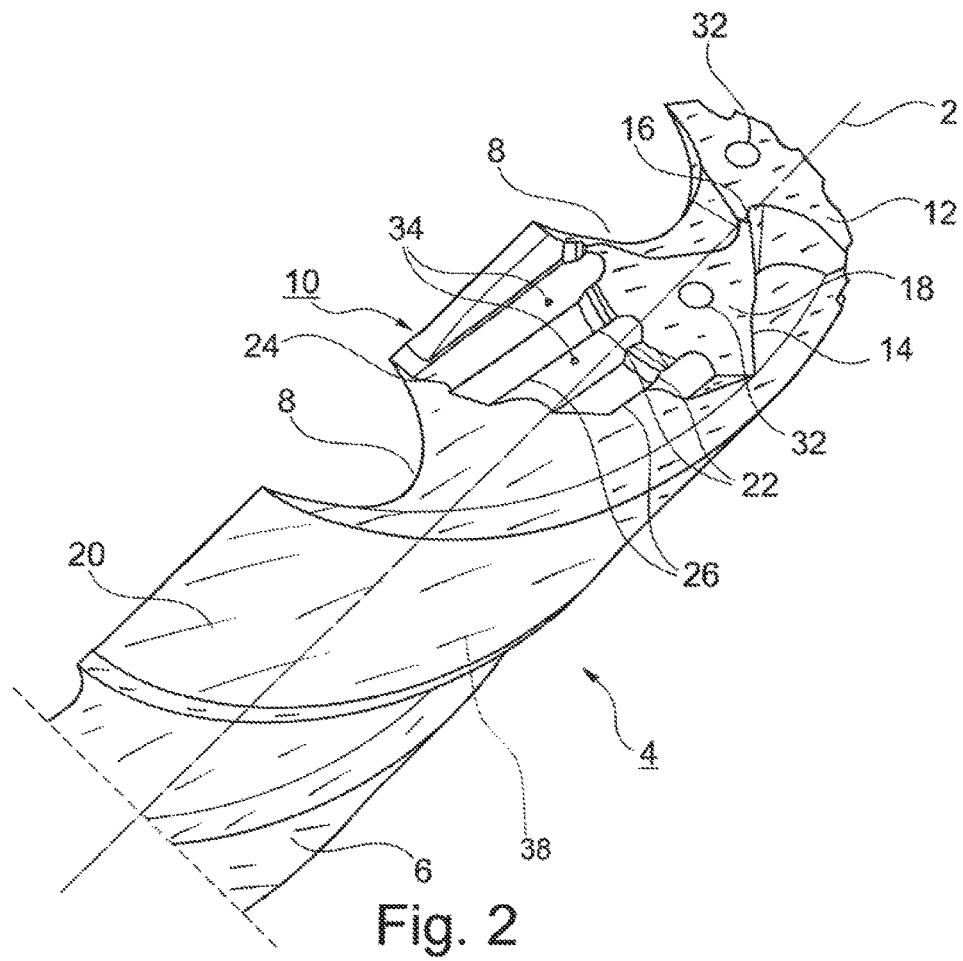
FIG. 2 shows a perspective representation in the form of a detail of a drilling/reaming tool.
Figure 3:
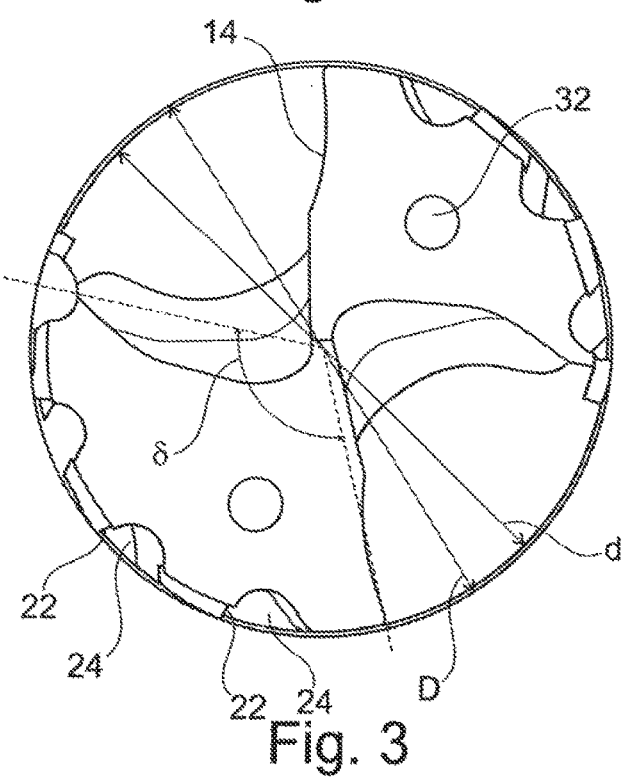
FIG. 3 shows an end view of a drilling/reaming tool.

This measure achieves the effect in the case of the exemplary embodiment of FIGS. 1 to 3 of a configuration in which the individual reaming flutes 24 open out into the respective main chip flute 8, and therefore these intersect as it were. On account of the spiraling, this takes place with different axial lengths. The axial length L of the reaming head 10 is in this case defined by the forwardmost region of the drilling tip 12, therefore in the exemplary embodiment the center line 16, and in the rearward part by the end of the longest reaming flute 24, and therefore when the latter goes over into the main chip flute 8. The axial length L of the reaming head 10 in this case preferably lies in the range of 2 to 3 times the nominal diameter D.

Figure 4:
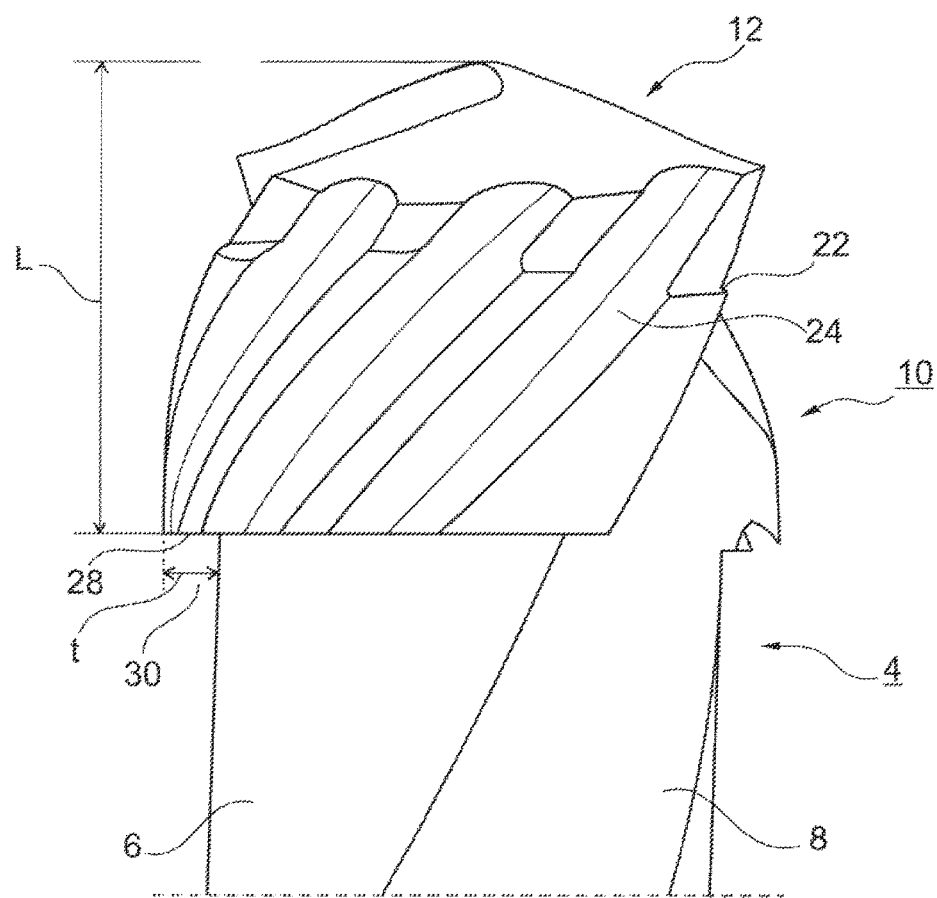
FIG. 4 shows a side view in the form of a detail of a second variant of the embodiment of a drilling/reaming tool.

As a difference from the one-piece tool 4 according to FIGS. 1 to 3, the second variant of the embodiment according to FIG. 4 is also formed in particular for modular tools 4, in which the reaming head 10 may for example be inserted as an exchangeable wearing part into the main body 6. Alternatively, the reaming head 10 is irreversibly fastened in the main body 6, for example by brazing. In the case of this variant of the embodiment, the reaming flutes 24 all end at an identical axial length, which at the same time defines the axial length L of the reaming head 10.

As can be seen from FIG. 4, the reaming head 10 has a greater diameter than a rearward part of the main body 6 adjoining the reaming head 10. Therefore, a set-back offset 28 is formed between the reaming head 10 and this rearward part. The radial depth t of the offset 28 is in this case greater than or equal to the radial depth of the respective reaming flutes 24. In particular, the radial depth t lies approximately in the range of 0.3 to 2 mm and is generally a fraction of the nominal diameter (for example approximately 2-6% of the nominal diameter D).

In the exemplary embodiment of FIG. 4, it is additionally provided that the second twist angle α2 is greater than the first twist angle α1, and therefore the reaming flutes 24 do not run toward the main chip flutes 8 and therefore do not intersect them either.

Both variants of the embodiment have in common that, during operation in which the tool 4 rotates about the longitudinal direction 2, reaming chips generated by the reaming blades 22 are carried away in the reaming flutes 24 and transferred into the main chip flutes 8. In the case of the exemplary embodiment of FIGS. 1 to 3, this takes place due to the reaming flutes 24 opening out directly into the main chip flutes 8. In the case of the exemplary embodiment of FIG. 4, this takes place indirectly by way of the clearance 30, which is defined by the offset 28 and during operation forms an annular space in relation to the wall of a drilled hole. The reaming chips enter this annular space at the end of the reaming head 10, when they emerge from the reaming flute 24. The continuing rotation of the tool 4 has the effect that they subsequently pass into the respective main chip flute, and therefore are taken along by the latter for further chip removal.

The particular advantage of the configuration described here can be seen in the fact that the reaming chips, which are much smaller in comparison with the main chips generated by the main (drilling) blades 14, are only carried in the reaming flutes 24 over a very short axial length and are subsequently carried away further in the much larger main chip flutes 8 together with the main chips. As a result, an effective transporting away of the chips is achieved. In particular in the case of great axial lengths of the tool, for example in the case of tools with an axial length greater than 4 to 5 times the nominal diameter D, the risk of a chip buildup in the reaming flutes 24 is avoided. Also avoided in particular is the risk that the reaming chips become caught between the secondary reaming blades 22 and the wall of the hole, and consequently damage the machined wall of the hole.

In particular, long tools 4 such as these often have the tendency to chatter, as it is known, i.e. the tool vibrates unwantedly during operation, which results in undesired chatter marks on the wall of the hole.

In order to minimize this chattering tendency as much as possible, an uneven division of the reaming blades 22 is provided. In the exemplary embodiment, one way of achieving this purpose is for the number of reaming blades on the two heels 20 to be different, which is assisted by different lengths (in the circumferential direction) of the heels 20. The angular distance between successive reaming blades 22 is preferably different from one another and reaming blades 22 that are assigned to one another, that is to say for example the first reaming blades 22 in each case following the respective main blade 14, are not arranged exactly opposite one another (at an angle of 180°). Another way that is provided in the exemplary embodiment is that of an uneven division of the main blades 14, i.e. these too are arranged in relation to one another at a rotational angle different from 180°.

In the exemplary embodiment of FIG. 3, beginning from the respective main blade 14, the heels extend up to the beginning of the chip flute over an angular portion 8. In the exemplary embodiment, the angle 8 for the larger heel 20 is at approximately 115° and that of the smaller heel is at approximately 85°. Four reaming blades 22 are provided on the longer heel and three reaming blades 22 are provided on the shorter heel.

In order to achieve a uniform loading of the reaming blades 22, it is also provided that the first reaming blade 22 following the respective main blade 14 is arranged offset rearwardly with respect to the second reaming blade 22 by an axial offset x2 (cf. FIG. 1). This offset x2 with respect to the axial height of the next following reaming blade 22 in this case lies approximately in the range of 0.005 to 2 mm. In FIG. 1, this offset is only indicated for exemplary purposes and is not true to scale. As a result, the machining performance that can be provided when the first reaming blade 22 is used in the way intended is reduced and adapted to that of the next-following reaming blade 22. On account of the main chip flute 8 preceding the first reaming blade 22, the reaming blade 22 would otherwise have to provide a much greater machining performance for a defined advancement. The axial offset x2 is in this case chosen in particular in such a way that, when there is an advancement as intended, for which the tool 4 is designed, the machining performances of the reaming blades 22 are largely identical. The next-following reaming blades 22 are preferably located at the same axial height.

For a high machining performance, a cooling is also provided in the exemplary embodiment. For this purpose, incorporated in the main body 6 are cooling channels 31, which run in the solid material of the respective heel 20. The cooling channels emerge at end-face first openings 32 on the end face of the drill tip 12. In the region of the reaming head 10, branch channels or bores (not represented any more specifically) lead from the cooling channels into the respective reaming flutes 24 and emerge there at second openings 34 in the flute base of the respective reaming flute 24 (cf. FIG. 2).

Figure 5:
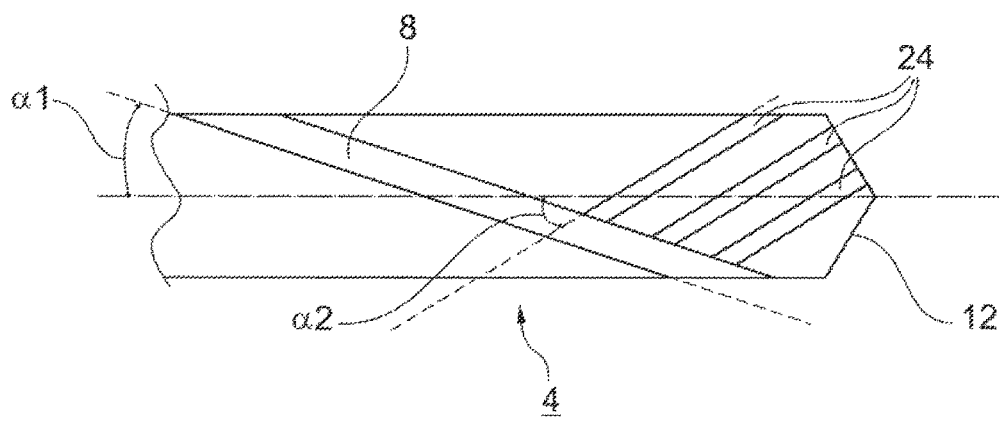
FIG. 5 shows a schematic side view of a further variant of the embodiment.

Schematically represented in FIG. 5 is a further variant of the embodiment, in which the main chip flute 8 and the reaming flutes 24 are oriented oppositely in relation to one another, i.e. the main chip flute 8 is oriented at a positive first twist angle α1 and the reaming flutes 24 are oriented at a negative second twist angle α2. Such a variant of the embodiment is used for workpieces with, for example, precast through-bores. During operation, the reaming chips are conveyed forward toward the drill tip, whereas the drilling chips are carried away rearward in the main chip flute 8.

Figure 6:
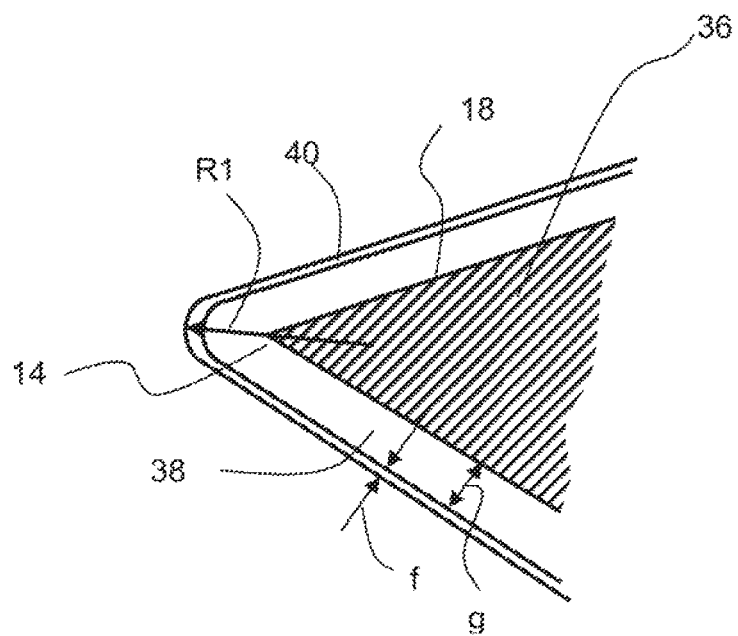
FIG. 6 shows a schematic sectional view in the region of a drilling blade with an applied base coating and fine coating.
Figure 7:
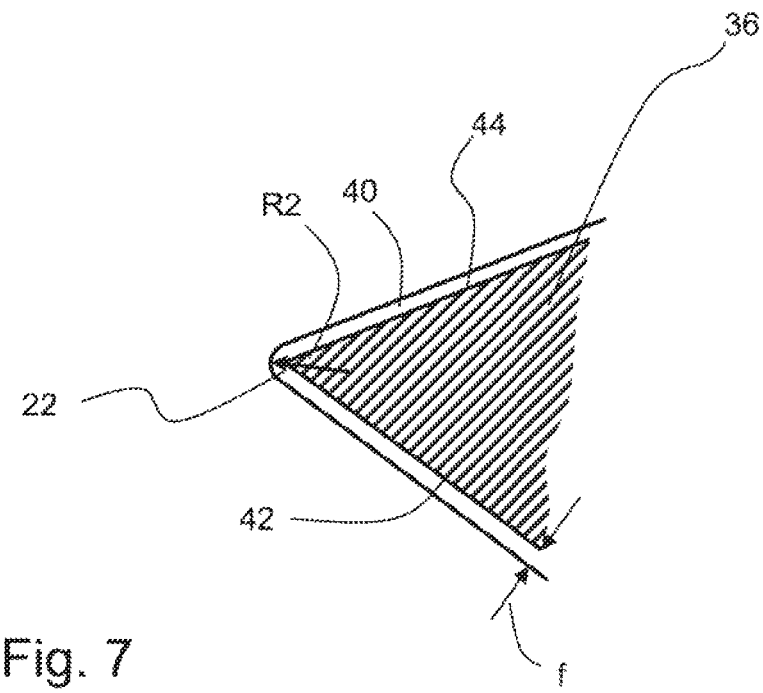
FIG. 7 shows a schematic sectional view in the region of a reaming blade with an applied fine coating.

The tools 4 represented in FIGS. 1 to 5 are preferably provided with a wear coating. By using a special process for this, the wear coating is formed differently in the region of the drilling tip 12 than in the region of the reaming head 10, at least in the region of the reaming blades 22. This is explained in more detail below in conjunction with FIGS. 6 and 7. FIG. 6 shows here a schematic sectional representation in the region of a main blade 14, the sectional plane being defined by a first straight line, which runs parallel to the longitudinal axis 2 and intersects the main blade 14 (center axis), and by a second straight line, which is oriented perpendicularly in relation to the first line and perpendicularly in relation to the main blade 14. FIG. 7 shows a comparable sectional representation in the region of a reaming blade 22. In a way similar to in the case of FIG. 6, the sectional plane is defined by a first straight line, which runs parallel to the longitudinal axis 2 and intersects the reaming blade 22, and by a second straight line, which runs perpendicularly in relation to the first line and in relation to the reaming blade 22.

Both FIGS. 6 and 7 show a cutting wedge 36 of the main body 6 that is formed on the respective blade 14, 22. The region represented in the figures merely serves for illustration of the wear coating and is not a representation of the wedge angle that is true to scale.

As can be seen from FIGS. 6 and 7, the main blade 14 is provided with a layered structure comprising two layers, built up consisting of a base coating 38 and an outer fine coating 40. By contrast, in the region of the reaming blade 22, only the fine coating 40 is provided. The base coating 38 has in this case a first layer thickness g, which preferably lies in the range of 5 to 15 μm. By contrast, the fine coating 40 has a much smaller layer thickness f, which lies only in the range of 1 to 2 μm. In the region of the main blade 14, the entire layered structure therefore has a layer thickness which is made up of the two layer thicknesses g and f.

On account of the greater layer thickness g in the region of the main blade 14, a rounding formed by the coating 38, 40 has a greater radius R1 than the corresponding radius R2 of the rounding in the case of the reaming blade 22. Usually, in the case of the thicker coating there also additionally forms a thickening in the manner of a lug, which tends to peel off when loading becomes relatively high. This risk would exist in particular in the region of the reaming blades 22.

To form the different layers, the following procedure is preferably followed in production:

Initially, the main body 6 is formed with the main chip flutes 8 and with the drilling tip 12, that is to say with the main blades 14 and the center line 16 and also the clearance faces 18. The drilling tip 12 is in this case generated by grinding from solid material. In the second step, a carbide coating is applied as a base coating 38, with the aid in particular of a PVD process. This base coating 38 has in this case—in a way similar to the fine coating 40—a hardness that is greater in comparison with the material of the main body 6. The main body 6 preferably consists of solid carbide.

In the subsequent process step, the entire region of the reaming head 10 is formed by grinding. Therefore, both the reaming blades 22 and the reaming flutes 24 and also the assigned secondary reaming blades 26 are formed. In the region of the respective reaming blades 22, therefore, both a reaming flute wall 42 and an assigned reaming clearance face 44 are also ground in particular during the grinding operation (cf. FIG. 7).

The grinding of the complete reaming head 10 has the effect of removing the base coating 38 again. The base coating 38 is also ground away circumferentially in the region of the heels between the individual reaming flutes 24. The base coating 38 is retained in the remaining regions, as is indicated by the hatching in FIG. 2. The hatching therefore indicates in particular the regions with the complete coating, made up of the base coating 38 and the fine coating 40. The base coating 38 therefore remains in the region of the main blade 14, the main secondary blade adjoining thereto, the main chip flute 8, the heel 20, and the clearance face 18. In the region of the face edge, in which the main blade 14 ends and the main secondary blade adjoins, the base coating 38 is likewise also retained in the circumferential region (heel) up to the first reaming flute 24.

In the next step, the fine coating 40 is applied once again with the aid of a PVD process, so that the ground-free areas of the reaming head 10, in particular in the region of the reaming blade 22, are only provided with the fine coating 40. In the case of the PVD application process, preferably the entire main body 6 provided with the main chip flutes 8 is coated, so that—apart from the ground-free areas in the region of the reaming head 10—the layered structure represented in FIG. 6 consisting of the base coating 38 and the fine coating 40 is formed everywhere, as is represented by the hatching in FIG. 2. The coating materials of these two coatings may be both identical and different. In the case of identical material, it is usually not possible to distinguish between the two layers, or at least only with difficulty. On account of the production process, an increase in the layer thickness from the layer thickness f to the combined layer thickness f+g is found in the transitional region between the ground-free areas and the adjoining areas. The increase in the layer thickness usually takes place here continuously within a narrowly limited range.

While specific exemplary embodiments of the invention have been described in detail, it will be appreciated by those skilled in the art that various modifications and alternatives to the details provided herein could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

The invention claimed is:

1. A process for producing a tool having a main body which extends in a longitudinal direction, at least one blade for machining a workpiece, and at least one flute associated with the at least one blade, the process comprising:
grinding a coated body having a base coating disposed therein in a manner that removes the base coating in a region of the coated body, wherein grinding the coated body comprises one of:
a) providing the coated body having at least one preformed blade and at least one preformed flute, each of the preformed blade and the preformed flute having the base coating disposed thereon, and then grinding the at least one preformed blade in a manner that removes the base coating in a region of the at least one preformed blade including a clearance face of the at least one preformed blade and a flute wall of the at least one preformed flute to form at least one ground blade and at least one ground flute; or
b) grinding the coated body in a manner which substantially concurrently 1) forms at least one ground blade having a clearance face and at least one ground flute having a flute wall; and 2) removes the base coating in the region of the at least one ground blade the clearance face of the at least one ground blade, and the flute wall of the at least one ground flute; and
providing a second coating to the at least one ground blade.

2. The process of claim 1 wherein:
grinding the coated body comprises grinding the coated body in a manner which substantially concurrently 1) forms the at least one ground blade having a clearance face and at least one ground flute having a flute wall; and 2) removing the base coating in the region of the at least one ground blade, the clearance face of the at least one ground blade, and the flute wall of the at least one ground flute.

3. The process of claim 1 wherein the second coating has a smaller layer thickness than the base coating.

4. The process of claim 3 wherein the second coating layer has a layer thickness smaller than the base coating by a factor in the range of 2-10.

5. The process of claim 3 wherein the second coating layer has a layer thickness in the range of 1-2 µm.

6. The process of claim 1 wherein:
the base coating is applied with the aid of physical vapor deposition; and
the second coating is applied with the aid of physical vapor deposition.

7. The process of claim 1 wherein the tool is a rotational tool.

8. The process of claim 1 wherein:
the tool is a drilling/reaming tool;
the at least one blade comprises at least one reaming blade;
the coated body comprises on an end face, a drilling tip with at least one main drilling blade; and
grinding the coated body removes the base coating in the region of the reaming blade without removing the base coating in a region of the at least one main drilling blade.

9. The process of claim 1 further comprising, prior to grinding the coated body:
grinding a blank to a desired size;
grinding main drilling blades and main chip flutes in the blank; and
providing the base coating on the blank to form the coated body.

10. The process of claim 9, wherein grinding the coated body does not remove the base coating in the region of the main chip flutes.

11. The process of claim 1, wherein the base coating has a hardness that is greater than a hardness of the main body.

12. The process of claim 11, wherein the main body comprises carbide.

13. The process of claim 1, wherein a coating material of the base coating is the same as a coating material of the fine coating.

14. The process of claim 1, wherein a coating material of the base coating differs from a coating material of the fine coating.

15. The process of claim 1, wherein providing the second coating to the at least one ground blade is performed after grinding.

16. The process of claim 3, wherein the base coating layer has a layer thickness in the range of 5-15 µm.

17. A process for producing a tool for machining a workpiece, the tool having a main body which extends in a longitudinal direction, the process comprising:
grinding at least one drilling blade and at least one main chip flute in a blank to form a body;
providing a base coating on the body to provide a coated body, the base coating having a first layer thickness;
grinding at least one reamer blade and at least one reamer chip flute in the coated body, thereby removing the base coating in a region of the at least one reamer blade and not removing the base coating in a region of the at least one drilling blade; and providing a second coating to the at least one reamer blade, the second coating having a second layer thickness, wherein the second layer thickness is smaller than the first layer thickness.

18. The process of claim 17 further comprising providing the second coating to the at least one drilling blade such that the at least one drilling blade is provided with the base coating and the second coating disposed on the base coating.

19. A process for producing a tool having a main body which extends in a longitudinal direction, the process comprising:

grinding at least one drilling blade and at least one reamer blade into a blank to form a body;

providing a base coating on the body to form a coated body, the base coating having a first layer thickness; and grinding the coated body in a region of the at least one reamer blade to remove the base coating from the region of the at least one reamer blade; and providing a second coating to the coated body such that at least the region of the at least one reamer body is coated with the second coating, the second coating having a second layer thickness, wherein the second layer thickness is smaller than the first layer thickness.

* * * * *